(12) United States Patent
Louh

(10) Patent No.: US 8,071,276 B2
(45) Date of Patent: Dec. 6, 2011

(54) METHOD FOR MAKING ALIGNMENT MARK ON SUBSTRATE

(75) Inventor: Sei-Ping Louh, Tu-Cheng (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 232 days.

(21) Appl. No.: 12/634,803

(22) Filed: Dec. 10, 2009

(65) Prior Publication Data
US 2010/0248161 A1    Sep. 30, 2010

(30) Foreign Application Priority Data

Mar. 30, 2009  (CN) .......................... 2009 1 0301198

(51) Int. Cl.
*G03F 7/20* (2006.01)
(52) U.S. Cl. ........................ 430/324; 430/321
(58) Field of Classification Search .................. None
See application file for complete search history.

(56) References Cited

U.S. PATENT DOCUMENTS

| | | | | |
|---|---|---|---|---|
| 6,979,526 B2 * | 12/2005 | Ning | ............................. | 430/314 |
| 2002/0192926 A1 * | 12/2002 | Schroeder et al. | ............ | 438/401 |
| 2008/0305439 A1 * | 12/2008 | Khan | ............................. | 430/321 |

* cited by examiner

*Primary Examiner* — John A. McPherson
(74) *Attorney, Agent, or Firm* — Altis Law Group, Inc.

(57) ABSTRACT

An exemplary method for making an alignment mark on a substrate includes the following steps. First, a substrate with a recess is provided. Second, a photoresist layer is formed on a surface of the substrate including in the recess. Third, the photoresist layer is exposed and developed to leave a body of remaining photoresist in the recess, with the body of remaining photoresist protruding above the surface of the substrate. Fourth, a metal layer is formed in an unfilled area of the recess and on the surface of the substrate, with the metal layer substantially surrounding the remaining photoresist. Finally, the remaining photoresist is removed to form an alignment mark in the metal layer on the substrate.

12 Claims, 8 Drawing Sheets

METHOD FOR MAKING ALIGNMENT MARK ON SUBSTRATE

BACKGROUND

1. Technical Field

The present disclosure relates to a method for making an alignment mark on a substrate, such as a substrate that is subsequently used as a press mold.

2. Description of Related Art

With the ongoing development of optical imaging technology, wafer level lens modules are now widely used in electronic devices such as digital cameras, mobile phones, etc.

Generally, a wafer level lens module includes wafer level optical members, such as lenses, filters, etc, and a wafer level image sensor. In a process of manufacturing a wafer level lens module, a first wafer including many first wafer level optical members arranged in an array, a second wafer including many second wafer level optical members arranged in an array, and a third wafer including many wafer level image sensors arranged in an array are fabricated. Then in assembly, the first wafer is coupled to the second wafer, and subsequently is coupled to the third wafer to form a wafer level lens module array. Finally, the wafer level lens module array is cut into many individual wafer level lens modules by laser cutting. In the process of fabricating each of the first and second wafers, the first (second) wafer level optical members are formed by pressing a precision mold on a base material of the first (second) optical members arranged on a wafer. The precision mold includes a small substrate, which has many mold cavities arranged in an array therein.

When coupling the first wafer to the second wafer, the first wafer level optical members need to be precisely coaxial with the respective second wafer level optical members. Otherwise, so-called eccentricities occur. The eccentricities lower the quality of the wafer level lens modules. For assuring such coaxial alignment, at least one alignment mark is formed on the small substrate of the precision mold by a cutter. The alignment mark of the small substrate forms a corresponding alignment mark on each of the first and second wafers. Then when the first wafer is coupled to the second wafer, the alignment marks of the two wafers are aligned with each other. As a result, the first wafer level optical members can be coaxial with the respective second wafer level optical members.

However, because the edge of the cutter is rather thick, small alignment marks with narrower width cannot be formed on the small substrate of the precision mold.

Therefore, what is needed is a method for making an alignment mark on a substrate, which can overcome the limitations described above.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

Figure 8:
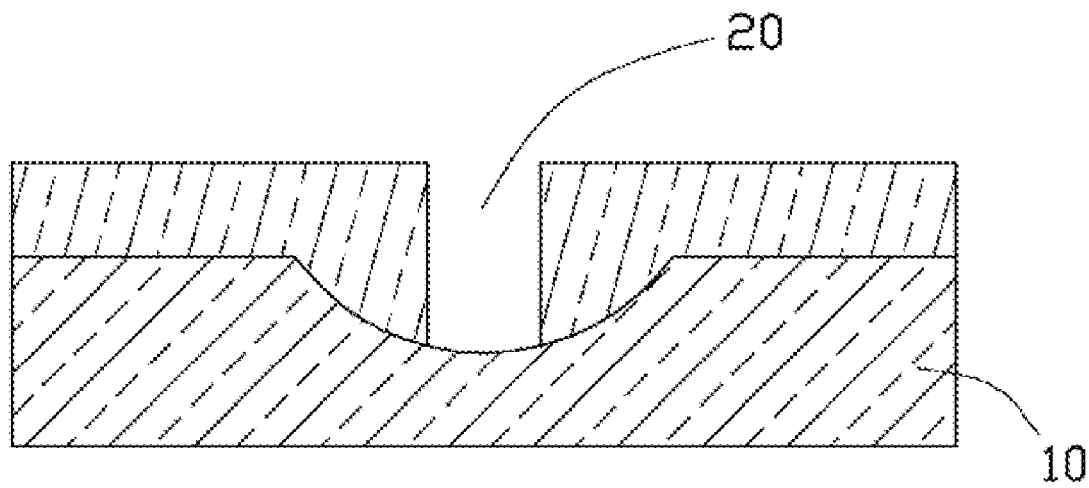
FIG. 8 is a cross-sectional view of an alignment mark on a substrate, formed by the process illustrated in FIGS. 2-7.

FIG. 8 shows an exemplary alignment mark 20 on a substrate 10. An exemplary method for making the alignment mark 20 on the substrate 10 is summarized in FIG. 1.

Figure 1:
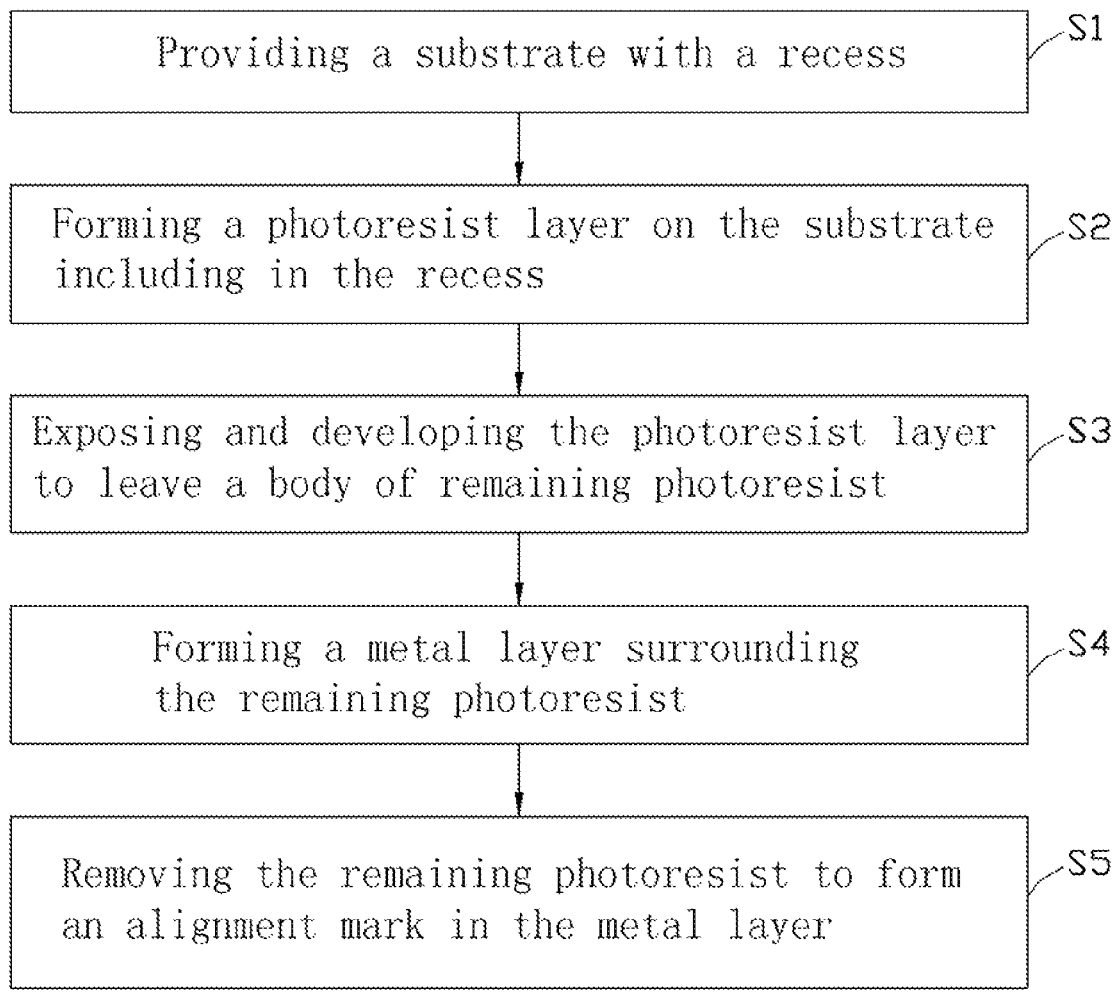
FIG. 1 is a flowchart of a method for making an alignment mark on a substrate according to an exemplary embodiment.
Figure 2:
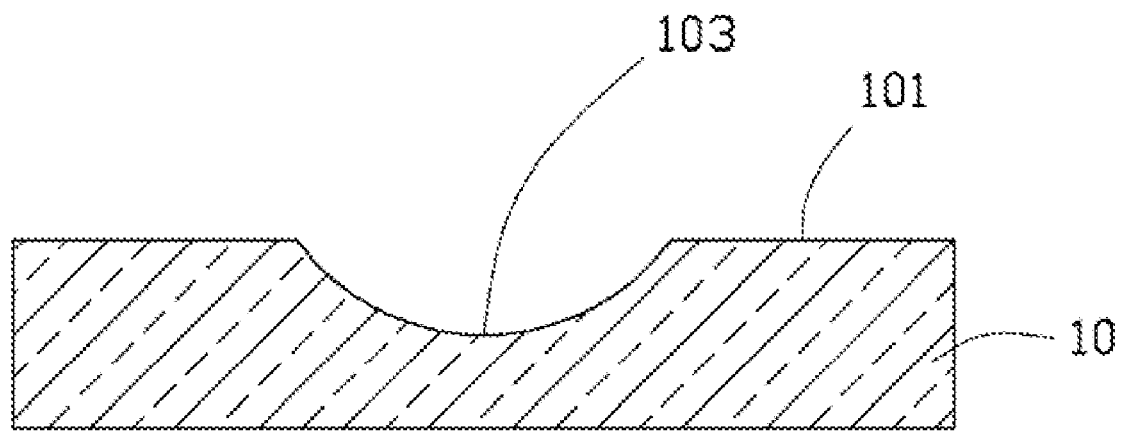
FIGS. 2-7 are cross-sectional views illustrating successive stages in a process for making the alignment mark on the substrate according to the method of FIG. 1.

Referring to FIGS. 1-2, in step S1, the substrate 10 is firstly provided. In the present embodiment, the substrate 10 is made of nickel (Ni). In other embodiments, the substrate 10 may instead be made of silicon carbide (SiC), silicon nitride ($Si_3N_4$), platinum (Pt), aluminum oxide ($Al_2O_3$), etc. The substrate 10 includes a surface 101, and a recess 103 defined in the surface 101. In the present embodiment, the recess 101 is formed by a turning method.

Figure 3:
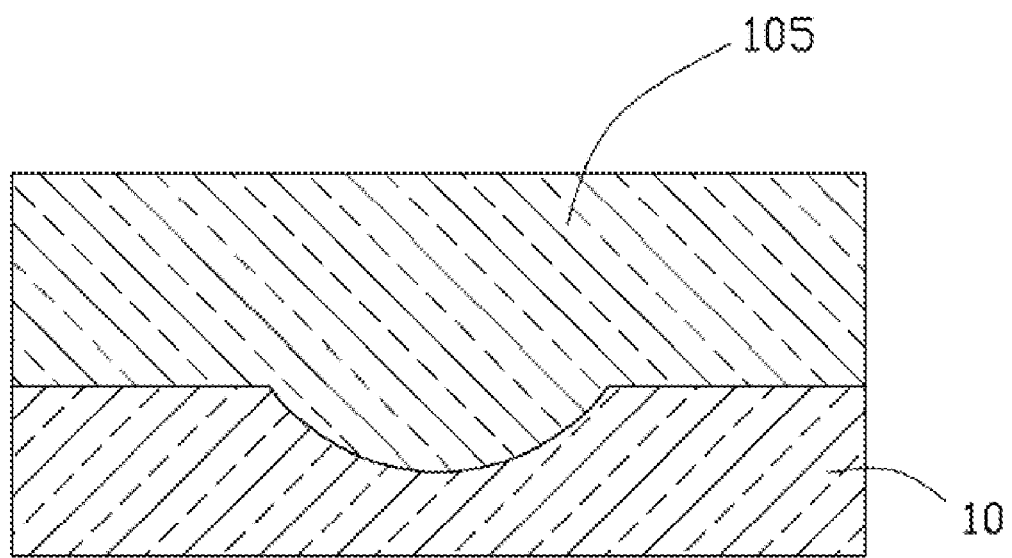

In step S2, referring to FIG. 3, a photoresist layer 105 is formed on the surface 101 and in the recess 103. In the present embodiment, the photoresist layer 105 is formed by spin coating. In the spin coating process, the thickness of the photoresist layer 105 can be effectively controlled.

Figure 4:
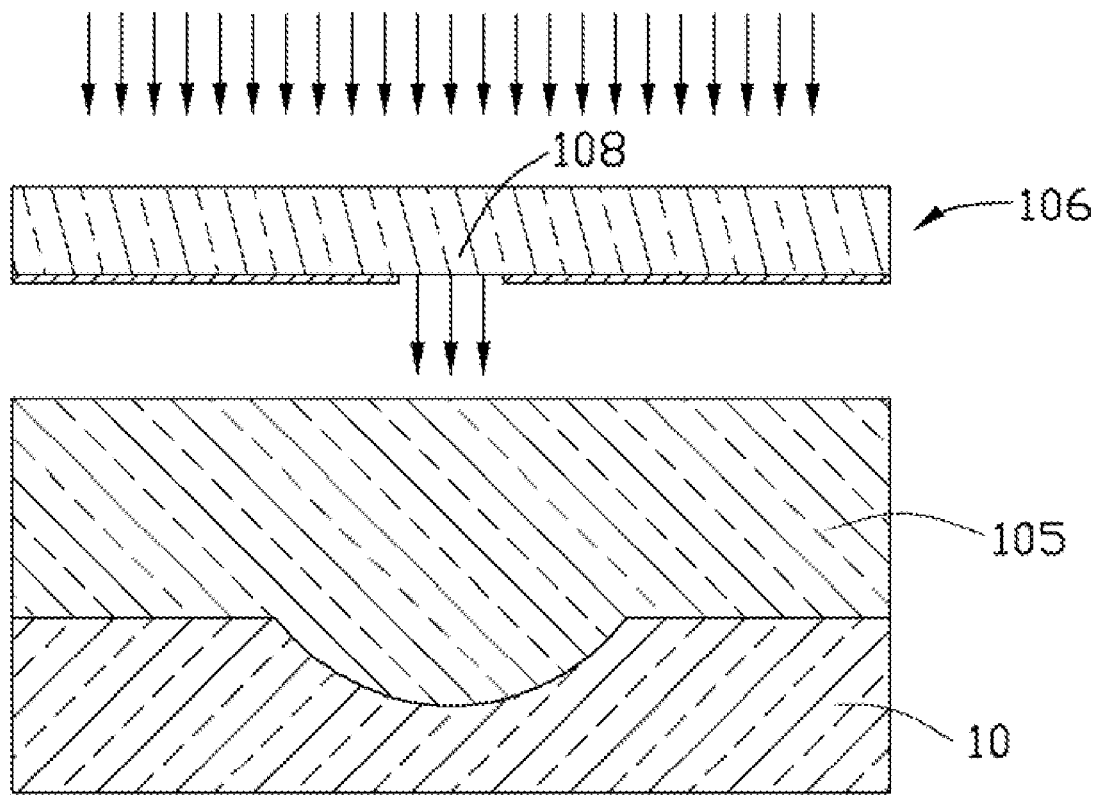
Figure 5:
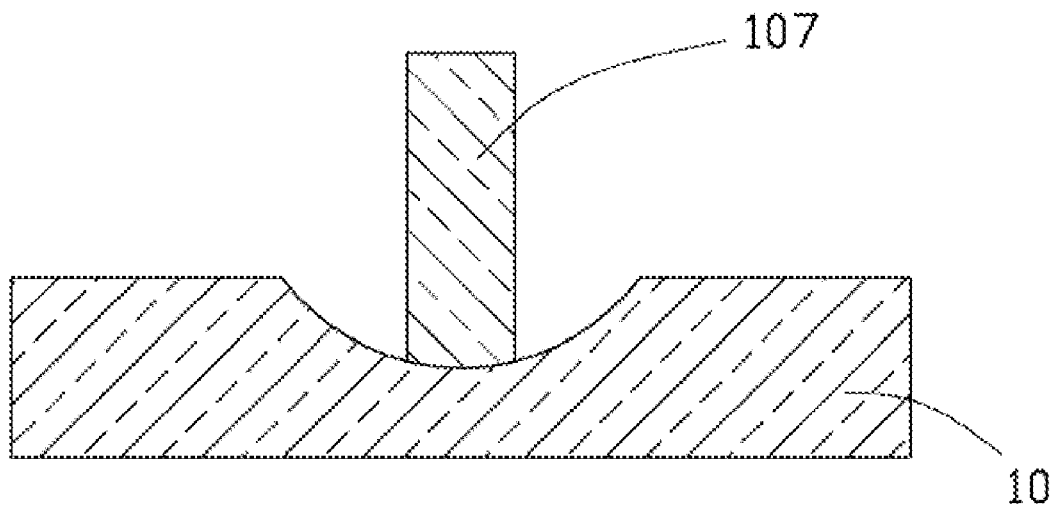

In step S3, referring to FIGS. 4-5, a photomask 106 with a light transmissive part 108 is positioned over the photoresist layer 105. The photoresist layer 105 is exposed by light (e.g., yellow light, ultraviolet light, etc) passing through the light transmissive part 108, and is then developed using a developing solution (not shown). Thereby, a body of remaining photoresist 107 is retained in the recess 103. In the present embodiment, the light transmissive part 108 is cylindrical or disk-shaped, such that the remaining photoresist 107 is correspondingly substantially cylindrical. The remaining photoresist 107 protrudes from the surface 101, and the diameter of the remaining photoresist 107 is approximately 15 micrometers ($\mu m$). In other embodiments, the remaining photoresist 107 may instead be shaped substantially as a triangular prism, a quadrangular prism, etc.

Figure 6:
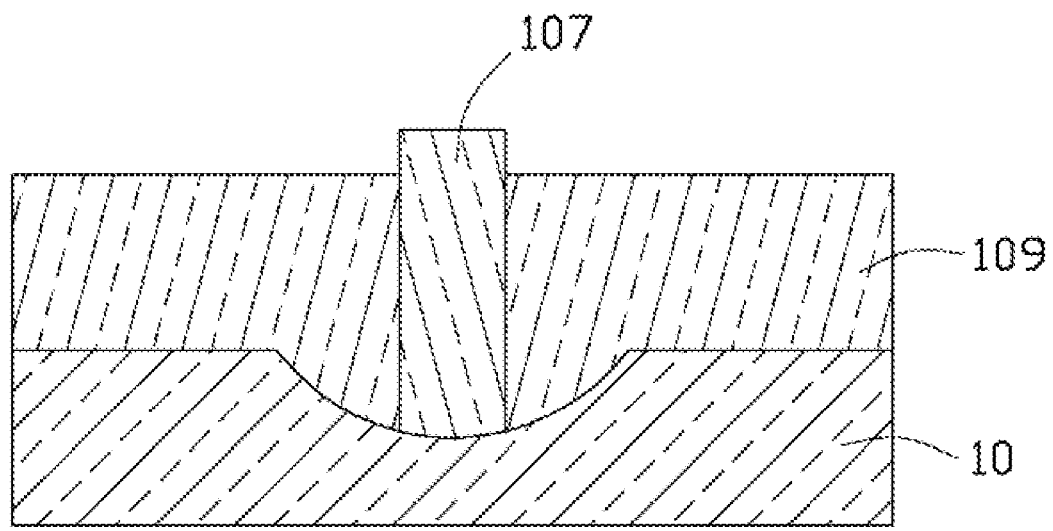

In step S4, referring to FIG. 6, a metal layer 109 is formed on the surface 101 and in unfilled areas of the recess 103. The metal layer 109 substantially surrounds the remaining photoresist 107. In this embodiment, a top end portion of the remaining photoresist 107 protrudes out from a top of the metal layer 109, and the metal layer 109 is made of copper. In other embodiments, the top end portion of the remaining photoresist 107 may be flush with the top surface of the metal layer 109. The metal layer 109 may instead be made of aluminum (Al), nickel, nickel-copper (Ni—Cu) alloy, etc.

Figure 7:
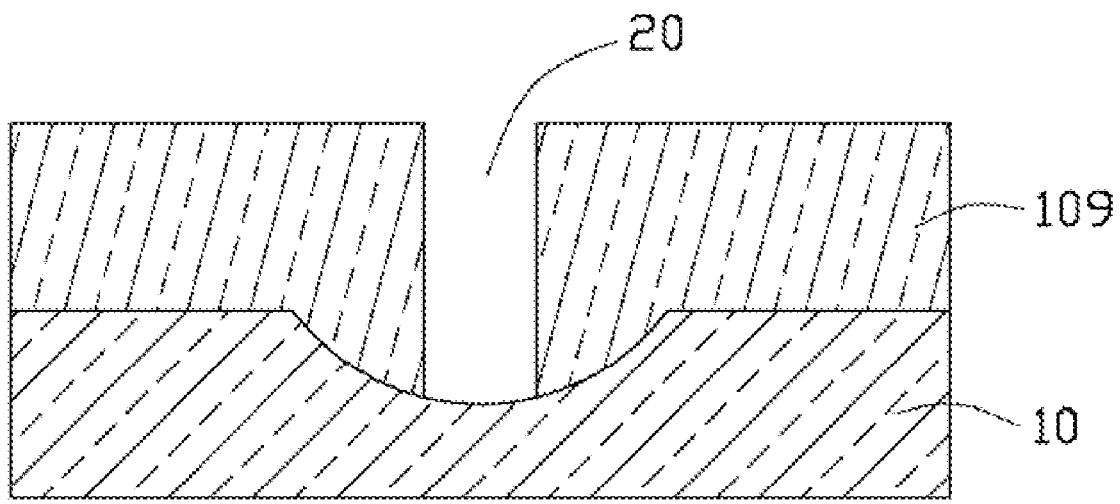

In step S5, referring to FIG. 7, the remaining photoresist 107 is removed from the substrate 10 to form the alignment mark 20 surrounded by the metal layer 109 on the substrate 10. This can be performed using, e.g., acetone organic solution. In the present embodiment, because the remaining photoresist 107 is substantially cylindrical, the alignment mark 20 is in the form of a cylindrical through hole in the metal layer 109.

Referring also to FIG. 8, the metal layer 109 is polished to make the top surface of the metal layer 109 substantially planar.

In the method for making the alignment mark 20 on the substrate 10, the photoresist layer 105 is exposed and developed such that the remaining photoresist 107 has a relatively small size. Accordingly, the alignment mark 20 formed by removing the remaining photoresist 107 has a correspondingly small size.

While certain embodiments have been described and exemplified above, various other embodiments will be apparent to those skilled in the art from the foregoing disclosure. The disclosure is not limited to the particular embodiments described and exemplified but is capable of considerable variation and modification without departure from the scope of the appended claims.

What is claimed is:

1. A method for making an alignment mark on a substrate, the method comprising:
   providing a substrate with a recess;
   forming a photoresist layer on a surface of the substrate including in the recess;
   exposing and developing the photoresist layer to leave a body of remaining photoresist in the recess, the remaining photoresist protruding above the surface of the substrate;
   forming a metal layer in an unfilled area of the recess and on the surface of the substrate, the metal layer substantially surrounding the remaining photoresist; and
   removing the remaining photoresist to form an alignment mark in the metal layer on the substrate.

2. The method of claim 1, further comprising forming the recess in the substrate by a turning method.

3. The method of claim 1, wherein after the metal layer is formed, the remaining photoresist protrudes from the metal layer.

4. The method of claim 1, wherein the metal layer is comprised of material selected from the group consisting of copper, aluminum, nickel, and nickel-copper alloy.

5. The method of claim 1, wherein the photoresist layer is formed by spin coating.

6. The method of claim 1, wherein the alignment mark is in the form of a through hole in the metal layer.

7. The method of claim 6, wherein the through hole has a shape selected from the group consisting of cylindrical and a polygonal prism.

8. A method for making an alignment mark on a substrate, the method comprising:
   providing a substrate that has a surface;
   forming a recess on the substrate by a turning method;
   forming a photoresist layer on the surface of the substrate including in the recess by a spin coating method;
   exposing and developing the photoresist layer to leave a portion of the photoresist remaining in the recess, the remaining portion of photoresist protruding above the surface of the substrate;
   forming a metal layer on the surface of the substrate including an unfilled area of the recess, the metal layer substantially surrounding the portion of remaining photoresist; and
   removing the portion of remaining photoresist to obtain an alignment mark in the metal layer on the substrate.

9. The method of claim 8, wherein after the metal layer is formed, the portion of remaining photoresist protrudes from the metal layer.

10. The method of claim 8, wherein the metal layer is comprised of material selected from the group consisting of copper, aluminum, nickel, and nickel-copper alloy.

11. The method of claim 8, wherein the alignment mark is in the form of a through hole in the metal layer.

12. The method of claim 11, wherein the through hole has a shape selected from the group consisting of cylindrical and a polygonal prism.

* * * * *